(12) United States Patent
Yin et al.

(10) Patent No.: US 6,903,584 B2
(45) Date of Patent: Jun. 7, 2005

(54) CIRCUIT AND METHOD FOR DETECTING THE STATE OF A SWITCH

(75) Inventors: Rong Yin, Coppell, TX (US); Tom Youssef, Dallas, TX (US); David McClure, Carrollton, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 421 days.

(21) Appl. No.: 10/094,165

(22) Filed: Mar. 8, 2002

(65) Prior Publication Data

US 2003/0168918 A1 Sep. 11, 2003

(51) Int. Cl.⁷ .............................. H03L 7/06; H02B 1/24
(52) U.S. Cl. ...................... 327/147; 327/530; 340/479; 307/116
(58) Field of Search ................................ 307/112, 116, 307/108, 110, 130; 327/115, 147, 154, 374, 108, 530; 710/260, 303, 308, 320; 340/479, 644, 870.2; 713/300, 322, 601, 324

(56) References Cited

U.S. PATENT DOCUMENTS

| | | | | |
|---|---|---|---|---|
| 4,051,421 A | * | 9/1977 | Brinner et al. | 318/367 |
| 4,658,241 A | * | 4/1987 | Torre | 340/551 |
| 5,025,419 A | * | 6/1991 | Nishino | 365/221 |
| 5,841,644 A | * | 11/1998 | Lipo et al. | 363/37 |

OTHER PUBLICATIONS

U.S. Appl. No. 10/147,639, filed May 17, 2002, Youssef.

* cited by examiner

*Primary Examiner*—Rajnikant B. Patel
(74) *Attorney, Agent, or Firm*—Lisa K. Jorgenson; Andre M. Squwalski

(57) ABSTRACT

A circuit and method are disclosed for detecting activation of a switch, such as a mechanical switch. The circuit may include a first circuit for temporarily driving the second terminal of the switch to a second logic level. A second circuit, coupled to the switch, senses a voltage level of the second terminal of the switch and generates an output signal representative of the voltage sensed. A sequential logic circuit is responsive to the output signal of the second circuit so as to maintain a logic value representative of the switch having been closed.

29 Claims, 2 Drawing Sheets

CIRCUIT AND METHOD FOR DETECTING THE STATE OF A SWITCH

BACKGROUND OF THE INVENTION

1. Technical Field of the Invention

The present invention relates to detecting the state of an electrical device, and particularly to a circuit and method for detecting whether a switch is closed.

2. Description of the Related Art

Techniques exist for monitoring the condition of mechanical devices and detecting whether the mechanical devices have been tampered with or otherwise physically changed. For instance, existing security systems electronically are known to monitor the state of mechanical or magnetic switches disposed about a building in order to determine whether such switches change from an open state to a closed state or vice versa. In many instances, such security systems are not implemented in an efficient or reliable manner. Some existing security systems are bulky and consume a relatively sizeable amount of power.

What is needed is a circuit and method for reliably detecting the state of a device, such as a mechanical switch, that may be simply and inexpensively implemented in an electronics system with little circuit overhead.

SUMMARY OF THE INVENTION

Embodiments of the present invention overcome shortcomings in prior detection circuits and satisfy a significant need for a detection circuit for detecting whether a switch, such as a mechanical switch, has changed state. The detection circuit initially provides a non-zero voltage differential, such as a voltage differential between a high reference voltage level and a low reference voltage level, across the terminals of the switch. The detection circuit may provide the non-zero voltage differential for a predetermined period of time. Following the switch being activated and/or closed, the detection circuit senses whether the voltage differential appearing across the switch approaches zero volts and, in response, drives an output signal to a value indicative of the switch being closed.

In a first exemplary embodiment of the invention, the detection circuit includes a counter that is selectively activated to count clock pulses from a clock source, such as a ring oscillator circuit, and coupled to the switch so as to connect the switch between the high and low reference voltage levels during the time the counter is activated. Latch circuitry maintains the voltage differential appearing across the switch until the voltage differential changes to a voltage representative of a different logic level. A flip flop circuit is responsive to the voltage appearing across the switch so as to maintain a value indicative of whether the switch remains in an open condition or has been closed.

In a second exemplary embodiment of the invention, the detection circuit temporarily provides the non-zero voltage differential across the switch through use of feedback. Specifically, a drive circuit provides the non-zero voltage differential across the switch. A delay chain includes an input coupled to the switch and an output coupled to an input of a driver circuit so that the drive circuit is enabled to provide the non-zero voltage difference for only a predetermined period of time.

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION OF THE EXEMPLARY EMBODIMENTS

The present invention will now be described more fully hereinafter with reference to the accompanying drawings in which exemplary embodiments of the invention are shown. This invention may, however, be embodied in many different forms and should not be construed as being limited to the embodiments set forth herein. Rather, the embodiments are provided so that this disclosure will be thorough and complete, and will fully convey the scope of the invention to those skilled in the art.

Figure 1:
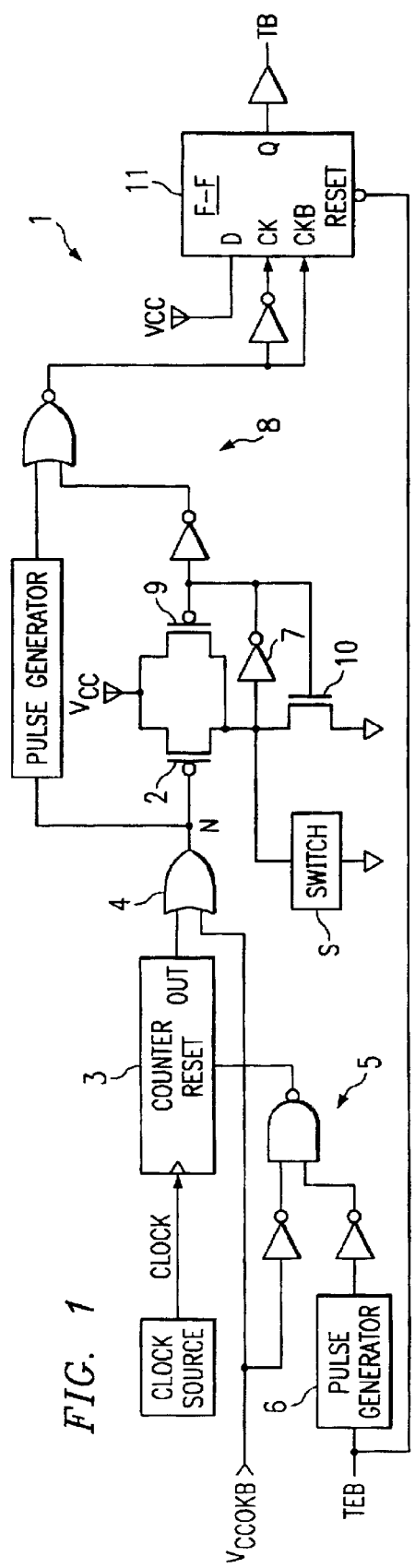
FIG. 1 is a circuit diagram of a detection circuit according to a first embodiment of the present invention.

Referring to FIG. 1, there is shown a detection circuit 1 for detecting a change in the electrical state of a switch S, such as a mechanical switch, according to a first exemplary embodiment of the present invention. In general terms, detection circuit 1 is capable of detecting whether switch S has been closed and generating a signal having a value indicative of the detection.

In order to detect a change in the electrical state of switch S, a voltage may be initially applied across the terminals of switch S and the voltage thereafter monitored to detect a change in the initially-applied voltage. Accordingly, detection circuit 1 may include drive circuitry that temporarily drives the voltage across switch S to a non-zero voltage level. The non-zero voltage may be, for example, the voltage difference between a logic high reference voltage level and a logic low reference voltage level. Switch S may be driven to the non-zero voltage level for a predetermined period of time. The drive circuitry may include a first transistor 2 which couples a first terminal of the switch S to a reference voltage level. In one example, a second terminal of switch S is coupled to a logic low reference voltage level, such as the ground reference, and thus transistor 2 couples the first terminal of switch S to the logic high reference voltage level, such as Vcc, as is shown in FIG. 1. Alternatively, first transistor 2 may couple the first terminal of switch S to the logic low reference voltage level, and thus the second terminal of switch S would be a voltage level.

The drive circuitry of detection circuit 1 may temporarily activate first transistor 2 for a predetermined period of time. Accordingly, the drive circuitry of detection circuit 1 may include a counter 3 that is activated or otherwise enabled to count so as to control the predetermined period of time that first transistor 2 is activated. For instance, counter 3 may receive, at a clock input thereof, a clock signal from a clock source, such as a clock signal from a ring oscillator circuit, and a control signal connected to a reset input of counter 3. An output of counter 3 may be coupled to the control terminal of first transistor 2 via a logic gate 4, such as a logic OR gate. In this way, the output signal of counter 3 may allow first transistor 2 to be activated during the time counter 3 counts clock pulses generated by the clock source, and cause first transistor 2 to be deactivated after a predetermined number of clock pulses have been counted.

Counter 3 may be activated or enabled from any of a plurality of sources. For instance, counter 3 may be activated upon completion of a power-up routine for the integrated circuit with which detection circuit 1 may be associated. The drive circuitry of detection circuit 1 may include logic circuitry 5 coupling a power-up signal Vccokb to the reset input of counter 3. In this way, when signal Vccokb transitions from an initial log ic one state (during the power-up routine) to a logic low state, counter 3 transitions from a reset state to an operational state for counting clock pulses.

In addition, counter 3 may be reset upon an enable signal TEB transitioning from a logic low state. A pulse generator circuit 6 may receive enable signal TEB and generate a pulse on an output signal of pulse generator circuit 6. The pulse signal passes through logic circuitry 5 to briefly reset counter 5. Thereafter, counter 5 is enabled to count a predetermined number of clock pulses.

Detection circuit 1 may further include sense circuitry for sensing switch S being activated and/or closed. In this case, the sense circuitry detects the voltage differential appearing across switch S dropping from a non-zero voltage level (as initially applied by the drive circuitry) to a voltage level approximately at zero volts. The sense circuitry may include a trigger circuit 7, such as a logic inverter gate, connected to the first terminal of switch S and which generates a logic one level following the voltage appearing on the first terminal of switch S falling to approximately zero volts. Logic circuitry 8 may receive the output of trigger circuit 7 and generate a signal that is indicative of switch S being activated.

The sense circuitry of detection circuit 1 may further relatively weakly maintain or latch the voltage appearing on the first terminal of switch S. In this regard, the sense circuitry may include pull-up transistor 9 and pull-down transistor 10 which maintain the first terminal of switch S at or near a voltage level to which the node was most previously driven. In particular, pull-up transistor 9 and pull-down transistor 10 may combine with trigger circuit 7 to form latch elements to maintain a voltage level on the first terminal of switch S to which the first terminal was driven, in the event the first terminal is no longer driven and would otherwise "float". Pull-up transistor 9 and pull-down transistor 10 may be "weak" transistors in that the first terminal of switch S may be easily driven to a different voltage level by first transistor 2 or switch S itself.

Detection circuit 1 may further include a sequential logic circuit to maintain or store a logic value that indicates whether or not switch S is detected in the closed position. The sequential logic circuit may include a flip flop circuit 11, such as a D-type flip flop. Flip flop circuit 11 may have one or more clock inputs coupled to the output of logic circuitry 8 and a data input coupled to a high logic level (Vcc) so that when the output of logic circuitry 8 transitions from a logic high level to a logic low level in response to switch S being closed, flip flop circuit 11 stores a logic high value. A reset input of flip flop circuit 11 may be coupled to enable signal TEB so that flip flop circuit 11 may be initially reset (i.e., store a logic low value) indicative of switch S being open.

It is understood that flip flop circuit 11 may be formed of different flip flop circuits, clocked by a different edge of the output of logic circuitry 8, have a data input coupled to a logic low voltage level (ground) and/or initialized to a different logic value while still being capable of storing a logic value that indicates whether or not switch S has been closed.

Detection circuit 1 may include circuitry which detects and records in flip flop circuit 11 switch S being closed even when first transistor 2 is activated to initialize the voltage appearing on the first terminal of switch S to logic high levels. In particular, switch S may be closed prior to detection circuit 1 being powered. Consequently, the first terminal of switch S will not transition from a logic high level to a logic low level and thereby cause flip flop circuit 11 to store a logic high value indicative of switch S being closed. To allow flip flop circuit 11 to store a logic high value in this situation, detection circuit 1 may include a pulse generator circuit 12 having an input coupled to the control terminal of first transistor 2 and an output coupled to a second input of logic circuitry 8. In this way, when first transistor 2 is being turned off (i.e., the control terminal thereof transitioning from a logic low level to a logic high level), a pulse is generated by pulse generator circuit 12 that causes flip flop circuit 11 to store a logic high value. As can be seen, logic circuitry 8 will prevent flip flop circuit 11 from storing a logic high value when switch S is open.

Figure 2:
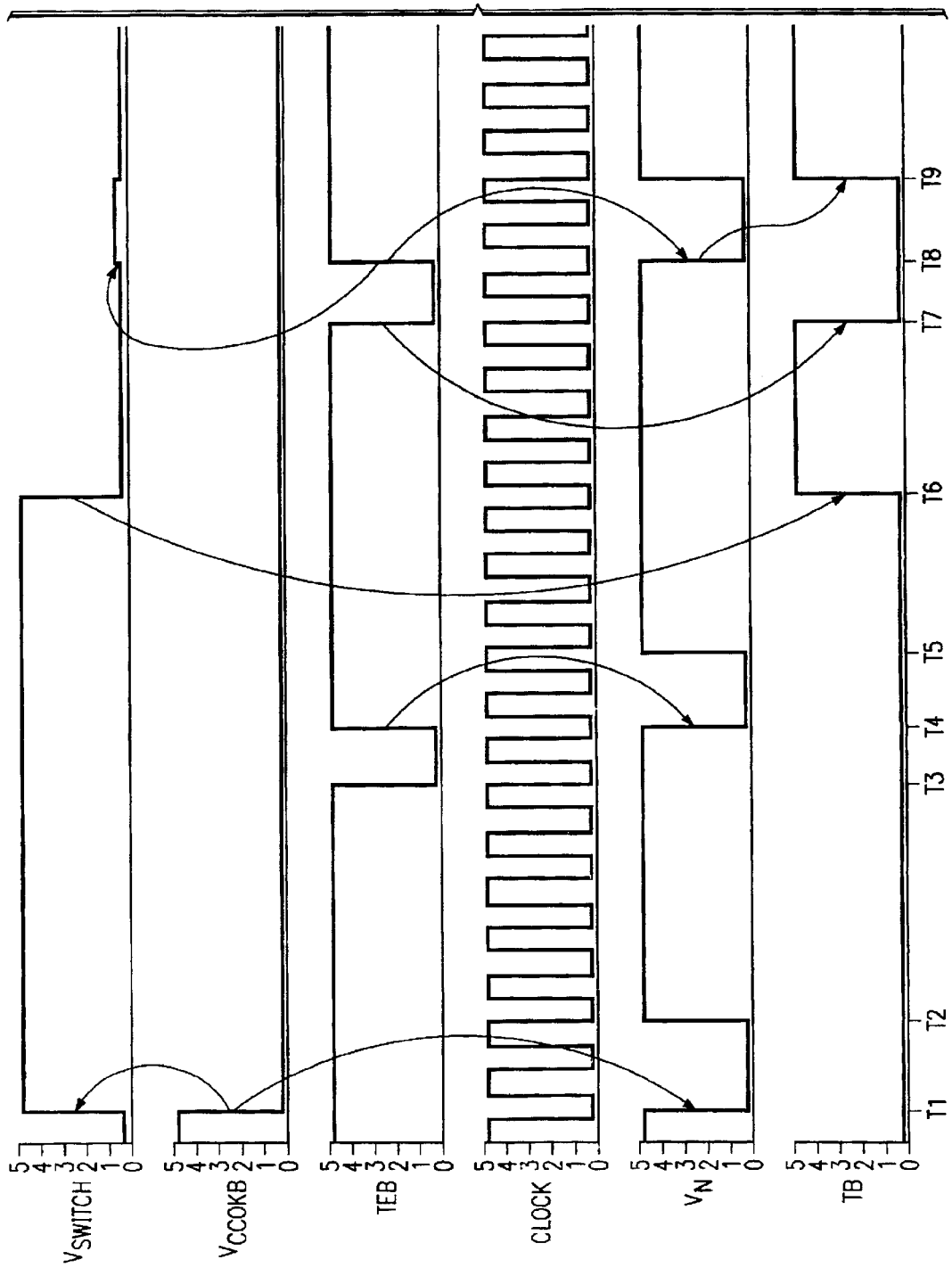
FIG. 2 is a timing diagram illustrating an operation of the detection circuit shown in FIG. 1.

The operation of detection circuit 1 will be described with respect to the timing diagram of FIG. 2. Initially, it is assumed that switch S is open. During power-up, signal Vccokb and enable signal TEB are at a logic high value. Counter 3 is reset and unable to count the pulses appearing on its clock input. At the completion of the power-up operation, which is performed external to detection circuit 1, signal Vccokb transitions to a logic low level at time t1. This transition activates first transistor 2 so as to charge the first terminal of switch S towards a logic high value. Once the voltage on first terminal of switch S reaches a logic high level, trigger circuit 7 is caused to output a logic low level which thereupon activates pull-up transistor 9 (and deactivates pull-down transistor 10) to charge the first terminal of switch S. The transition appearing on signal Vccokb also causes the reset input of counter 3 to be driven to a logic low level, which activates counter 3 and allows it to begin counting clock pulses. When counter 3 counts a predetermined number of clock pulses, the output signal of counter 3 transitions from a low logic level to a high logic level at time t2, which turns off first transistor 2. However, the voltage appearing on the first terminal of switch S remains at a logic high level due to the activation of pull-up transistor 9. Counter 3 stops counting and the output thereof remains at a logic high value.

At time t3, enable signal TEB transitions to a low logic level. This transition resets flip flop circuit 11 so that output signal TB is driven to a logic low level. When enable signal TEB transitions to a logic high level at time t4, counter 3 is caused to be temporarily reset, which drives the output of counter 3 to a logic low level and thereby reactivates first transistor 2. When counter 3 counts a predetermined number of clock pulses, the output signal of counter 3 transitions from a low logic level to a high logic level at time t5, which turns off first transistor 2. However, the voltage appearing on the first terminal of switch S remains at a logic high level due to the activation of pull-up transistor 9. Counter 3 stops counting and the output thereof remains at a logic high value.

At this point, detection circuit 1 is ready to detect whether switch S is closed.

Due to some activity external to detection circuit 1, switch S is closed at time t6. This causes the first terminal of switch S, which was previously at a logic high level, to be driven to a logic low level. When the first terminal of switch S is at a low logic level, the output of trigger circuit 7 transitions to a logic high level, which activates pull-down transistor 10 and deactivate pull-up transistor 9. In addition, the output of logic circuitry 8 is caused by trigger circuit 7 to transition from a logic high level to a logic low level, which causes flip flop circuit 11 to load and store a logic high level. The output of flip flop circuit 11 is driven to a logic high level to indicate that switch S is closed.

At time t7, enable signal TEB may transition to a low logic level while switch S remains closed. As with time t3, this transition resets flip flop circuit 11 so that output signal TB is driven to back a logic low level. When enable signal TEB transitions to a logic high level at time t8, counter 3 is caused to be temporarily reset, which drives the output of counter 3 to a logic low level and thereby reactivate first transistor 2 to attempt to charge the first terminal of switch S. However, switch S maintains the first terminal thereof at a logic low level. When counter 3 counts a predetermined number of clock pulses, the output signal of counter 3 transitions from a low logic level to a high logic level at time t9, which turns off first transistor 2. With the output of trigger circuit 7 being at a logic high level, the transition appearing on the control terminal of first transistor 2 causes a pulse that propagates through logic circuitry 8 so as to cause flip flop circuit 11 to store a logic high level. Output signal TB thereupon transitions back to a high logic level representative of switch S being in the closed position. In this way, an attempt to initialize conditions to monitor switch S during the time switch S is closed will still cause detection circuit 1 to detect switch S being closed.

Figure 3:
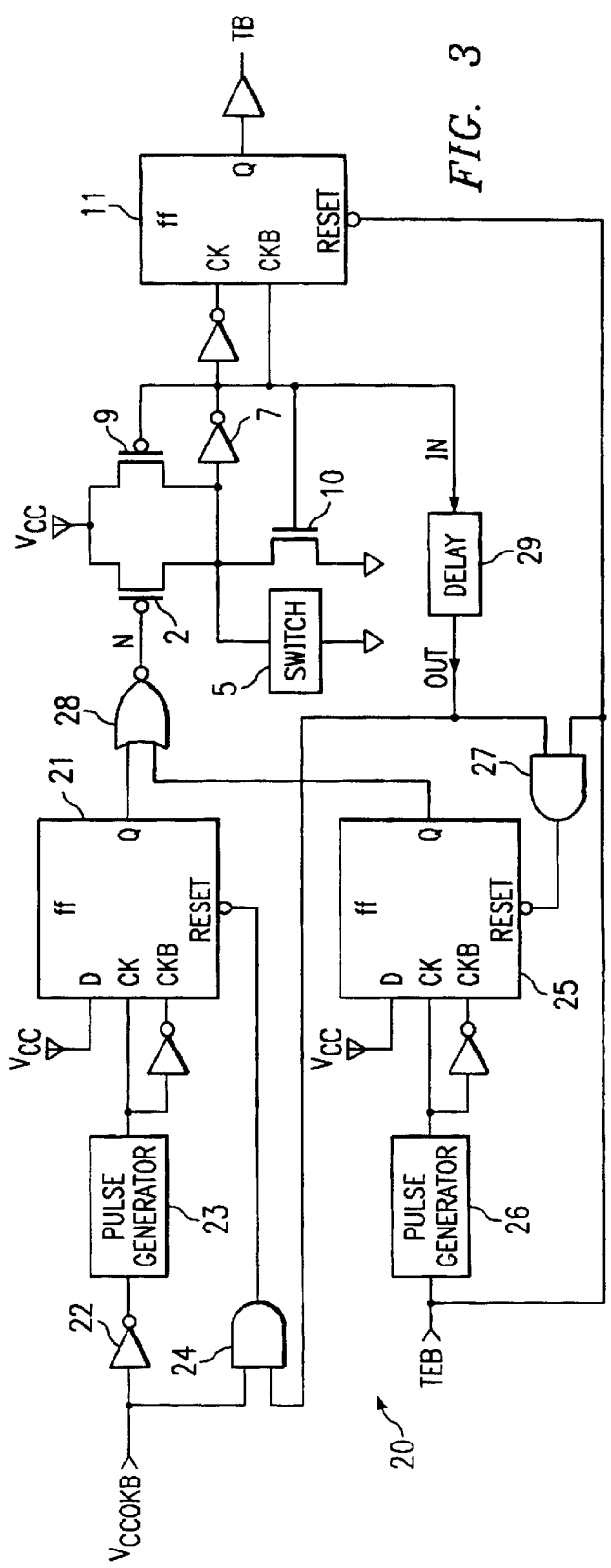
FIG. 3 is a circuit diagram of a detection circuit according to a second embodiment of the present invention.

Referring to FIG. 3, there is shown a detection circuit 20 according to a second exemplary embodiment of the present invention. Instead of using a counter 3 to limit the period of time first transistor 2 is activated, detection circuit 20 uses feedback from the output of trigger circuit 7. Specifically, input signal Vccokb is coupled to the clock inputs of flip flop circuit 21 via logic inverter 22 and pulse generator circuit 23. The data input of flip flop circuit 21 is tied to a high logic level, and the reset input of flip flop circuit 21 is coupled to input signal Tccokb via logic AND gate 24. Similarly, input enable signal TEB is coupled to the clock inputs of flip flop circuit 25 via pulse generator circuit 26. The data input of flip flop circuit 25 is tied to a high logic level, and the reset input of flip flop circuit 25 is coupled to input enable signal TEB via logic AND gate 27. The output of flip flop circuits 21 and 25 drive a logic NOR gate 28, the output of which is coupled to the control terminal of first transistor 2. Feedback is provided with delay circuit 29, which includes an input coupled to the output of trigger circuit 7 and an output coupled to the input of logic AND gates 24 and 27.

It is understood that other flip flop circuits and logic circuitry may be used to implement detection circuit 20 without departing from the operation thereof.

Upon the completion of the power-up routine, input signal Vccokb transitions from a logic high level to a logic low level. This transition causes flip flop circuit 21 to load and store a logic high value, which thereupon activates first transistor 2 to charge the terminal of switch S. When the first terminal of switch S reaches a logic high voltage level, the output of trigger circuit 7 is driven low. Following the predetermined period of time corresponding to the delay of delay circuit 29, flip flop circuits 21 and 25 are reset, which causes first transistor 2 to be deactivated. A similar set of events occurs when input enable signal TEB transitions from a low logic level to a high logic level.

When switch S is closed, the output of trigger circuit 7 transitions from a low logic level to a high logic level, which causes flip flop circuit 11 to load and store a logic high value. Thereafter, output signal TB is driven to a logic high value to indicate that switch S is closed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A circuit for detecting activation of a switch having a first terminal coupled to a first logic level and a second terminal, comprising:
    a first circuit for temporarily driving the second terminal of the switch in an open state to a second logic level;
    a second circuit, coupled to the switch, for sensing a voltage level of the second terminal of the switch and generating an output signal representative of the voltage sensed; and
    a sequential logic circuit responsive to the output signal of the second circuit so as to maintain a logic value representative of the switch having been in a closed state.

2. The circuit of claim 1, wherein the first circuit comprises:
    a first transistor having a first terminal coupled to the second terminal of the switch and a second terminal coupled to the second logic level; and
    a third circuit coupled to a control terminal of the first transistor for temporarily activating the first transistor.

3. The circuit of claim 2, wherein the third circuit comprises a counter for defining a period of time the first transistor is temporarily activated.

4. The circuit of claim 3, wherein the third circuit further comprises a circuit for generating a clock signal, the clock signal being applied to a clock input of the counter.

5. The circuit of claim 3, wherein the third circuit further comprises a fourth circuit coupled to an input of the counter and to the first transistor and having at least one output for initially enabling the counter to begin counting a predetermined number of clock pulses applied to a clock input of the counter, while activating the first transistor.

6. The circuit of claim 5, wherein an input to the fourth circuit enables the counter to count and activates the first transistor around an end of a power-up operation.

7. The circuit of claim 6, wherein an input to the fourth circuit is coupled to receive a second input signal.

8. The circuit of claim 5, wherein an input to the fourth circuit is coupled to a reset input of the sequential logic circuit.

9. The circuit of claim 2, wherein the third circuit comprises:
    a flip flop circuit having at least one clock input coupled to an input of the circuit and an output coupled to the control terminal of the first transistor; and
    a feedback circuit having an input coupled to an output of the second circuit and an output coupled to a set/reset input of the flip flop circuit.

10. The circuit of claim 9, wherein the third circuit further comprises a pulse generator having an input coupled to the input of the circuit and an output coupled to the at least one clock input of the flip flop circuit.

11. The circuit of claim 10, wherein the input of the circuit is coupled to the set/reset input of the flip flop circuit.

12. The circuit of claim 9, wherein the third circuit further comprises a second flip flop circuit having at least one clock input coupled to a second input of the circuit and an output coupled to the control terminal of the transistor, the output of the feedback circuit being coupled to a set/reset input of the second flip flop circuit.

13. The circuit of claim 2, wherein the second circuit comprises:
    a second transistor coupled between the first transistor and second terminal of the switch and the second logic level;

a third transistor coupled between the second terminal of the switch and the first logic level; and a logic gate having an input coupled to the second terminal of the switch and an output coupled to a control terminal of the second transistor and the control terminal of the third transistor.

14. The circuit of claim 2, further comprising a fourth circuit having an input coupled to an output of the third circuit, for causing the sequential logic circuit to maintain a logic value indicative of the switch being closed.

15. A method for detecting whether a switch has been activated, the switch including a first terminal coupled to a voltage representative of a first logic level and a second terminal, the method comprising:

temporarily driving the second terminal of the switch when one to a second logic level;

relatively weakly driving the second terminal of the switch to the second logic level following the step of temporarily driving;

sensing whether a voltage level appearing on the second terminal of the switch is driven to a voltage level representative of the first logic level; and responsive to the step of sensing, generating and maintaining an output signal having a value indicative of the second terminal of the switch being closed.

16. The method of claim 15, wherein the step of generating and maintaining comprises maintaining the output signal in a flip flop circuit.

17. The method of claim 15, further comprising relatively weakly driving the second terminal of the switch to the voltage representative of the first logic level following the second terminal being driven to the voltage level representative of the first logic level.

18. The method of claim 15, wherein the step of temporarily driving comprises driving the second terminal of the switch to the second logic level for a predetermined period of time.

19. The method of claim 18, wherein the step of temporarily driving further comprises counting clock pulses to define the predetermined period of time.

20. The method of claim 15, wherein the step of temporarily driving comprises driving the second terminal of the switch to the second logic level upon completion of a power-up operation.

21. The method of claim 20, wherein the step of temporarily driving further comprises driving the second terminal of the switch to the second logic level upon initiation of a reset condition.

22. A circuit for detecting the conductivity of a switch, comprising:

first circuitry, having an output coupled to a second terminal of the switch for initially placing a non-zero voltage differential across the switch when in an oven state; and second circuitry having an input coupled to the second terminal of the switch for sensing a voltage differential appearing across the switch and an output for indicating whether the voltage appearing across the switch approaches zero volts when the switch is in a closed state, the second circuitry further maintaining the voltage differential across the switch following the voltage differential approaching zero volts.

23. The circuit of claim 22, wherein the second circuitry maintains the voltage differential across the switch following the first circuitry initially placing a non-zero voltage differential across the switch until the switch closes.

24. The circuit of claim 22, wherein the first circuitry comprises a first transistor coupled between the switch and a reference voltage source, and circuitry for activating the first transistor for a predetermined period of time.

25. The circuit of claim 24, wherein the first circuitry further comprises a counter that is activated to count clock pulses appearing on a clock input signal, the counter generating a counter output signal that deactivates the first transistor.

26. The circuit of claim 25, wherein the counter is activated to count clock pulses following the completion of a start-up operation.

27. The circuit of claim 24, further comprising a delay circuit having an input coupled to the second circuitry and an input coupled to an input of the first circuitry.

28. The circuit of claim 24, wherein the first circuitry comprises a first flip flop circuit having an output coupled to the control terminal of the first transisted, a set/reset input coupled to the output of the second circuitry and at least one clock input coupled to an input of the circuit.

29. The circuit of claim 22, further comprising a flip flop circuit having at least one clock input coupled to the output of the second circuitry.

* * * * *

UNITED STATES PATENT AND TRADEMARK OFFICE
CERTIFICATE OF CORRECTION

PATENT NO. : 6,903,584 B2
DATED : June 7, 2005
INVENTOR(S) : Rong Yin, Tom Youssef and David McClure It is certified that error appears in the above-identified patent and that said Letters Patent is hereby corrected as shown below:

Title page,
Item [74], *Attorney, Agent or Firm*, please replace "Squwalski" with -- Szuwalski --.

Column 2,
Line 47, please insert -- coupled to a logic high reference -- before "a voltage level".

Column 3,
Line 5, please replace "log ic" with -- logic --.

Column 7,
Line 16, please replace "one" with -- open --.

Column 8,
Line 7, please replace "oven" with -- open --.
Line 36, please insert -- output of the -- in front of "second".

Signed and Sealed this

Eleventh Day of October, 2005

JON W. DUDAS
*Director of the United States Patent and Trademark Office*